(12) United States Patent
Kim et al.

(10) Patent No.: US 8,022,311 B2
(45) Date of Patent: Sep. 20, 2011

(54) PRINTED CIRCUIT BOARD FOR IMPROVING TOLERANCE OF EMBEDDED CAPACITORS, AND METHOD OF MANUFACTURING THE SAME

(75) Inventors: Tae Eui Kim, Seoul (KR); Byoung Youl Min, Gyunggi-do (KR); Myung Sam Kang, Gyunggi-do (KR); Je Gwang Yoo, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1007 days.

(21) Appl. No.: 11/797,084

(22) Filed: Apr. 30, 2007

(65) Prior Publication Data

US 2008/0212299 A1    Sep. 4, 2008

(30) Foreign Application Priority Data

Mar. 2, 2007    (KR) .................. 10-2007-0020958

(51) Int. Cl.
*H05K 1/16*    (2006.01)
(52) U.S. Cl. ............. 174/260; 29/41; 29/830; 29/831; 29/852
(58) Field of Classification Search .......... 361/761–764; 174/260, 262–266; 29/25.41, 830, 831, 852
See application file for complete search history.

(56) References Cited

U.S. PATENT DOCUMENTS

| | | | |
|---|---|---|---|
| 7,092,237 B2 * | 8/2006 | Lee et al. ............ | 361/311 |
| 7,186,919 B2 * | 3/2007 | Kim et al. ........... | 174/250 |
| 2004/0165361 A1 * | 8/2004 | Kimura et al. ....... | 361/763 |
| 2004/0231885 A1 * | 11/2004 | Borland et al. ...... | 174/260 |

FOREIGN PATENT DOCUMENTS

| | | |
|---|---|---|
| JP | 2004-103967 | 4/2004 |
| JP | 2005-109316 | 4/2005 |
| JP | 2006-156934 | 6/2006 |
| TW | 200617098 | 6/2006 |

OTHER PUBLICATIONS

Office Action issued in corresponding Korean Patent Application No. 10-2007-0020958; mailed on Jan. 25, 2008.
Japanese Office Action dated Aug. 18, 2009 and issued in corresponding Japanese Patent Application 2007-210217.
Taiwanese Office Action issued Aug. 17, 2010 in corresponding Taiwanese Patent Application 096125032.

* cited by examiner

*Primary Examiner* — Kambiz Zand
*Assistant Examiner* — Abiy Getachew

(57) ABSTRACT

Disclosed are a printed circuit board for improving the tolerance of embedded capacitors and a method of manufacturing the same. The printed circuit board having embedded capacitors is manufactured by transferring and embedding a circuit layer having a lower electrode formed through an additive process into a resin insulating layer, and thereby is minimized in the circuit tolerance conventionally caused by an etching process to thus be applied to capacitors for RF matching.

11 Claims, 6 Drawing Sheets

PRINTED CIRCUIT BOARD FOR IMPROVING TOLERANCE OF EMBEDDED CAPACITORS, AND METHOD OF MANUFACTURING THE SAME

CROSS REFERENCE TO RELATED APPLICATION

This application claims the benefit of Korean Patent Application No. 10-2007-0020958, filed Mar. 2, 2007, entitled "printed circuit board for improving tolerance of embedded capacitors, and process for manufacturing the same", which is hereby incorporated by reference in its entirety into this application.

BACKGROUND OF THE INVENTION

1. Field of the Invention

The present invention relates, in general, to a printed circuit board (PCB) for improving the tolerance of embedded capacitors and a method of manufacturing the same. More particularly, the present invention relates to a PCB including embedded capacitors, which is minimized in a tolerance caused by an etching process and thus can be applied to capacitors for RF matching, and to a method of manufacturing the same.

2. Description of the Related Art

Recently, in electronic products including portable electronic instruments, various demands of consumers are increasing. In particular, in order to diversify functions of the products, to decrease the size and weight thereof, to increase the speed thereof, to reduce the price thereof, to increase portable convenience, to realize wireless internet service at any time, and to satisfy the design requirements of consumers, thorough research into such products has been conducted by developers, designers, and manufacturers.

As the functions of the products become more diversified, the number of passive components is increased in proportion to an increase in the number of ICs, and thus the size of the portable terminal is increased. Generally, electronic instruments have pluralities of active components and passive components, which are mounted on the surface of a circuit substrate. Furthermore, numerous passive components are mounted on the surface of the substrate in the form of discrete chip capacitors to efficiently realize the signal transmission between the active components.

According to demands for high-density mounting of electronic systems, embedded PCBs have been developed in many related companies. Examples of passive components, which are embedded in the substrate, include resistors R, inductances L, and capacitors C. The embedded components are classified into conventional passive components, thin passive components, film elements obtained through printing or sputtering, and plating elements, depending on the size and type thereof. However, discrete chip capacitors, that is, passive components, have limitations in aiding the trend toward the fabrication of light, slim, short and small electronic components, and also have disadvantages in incurring space utilization problems and increasing manufacturing costs.

Therefore, research into methods and types of embedding passive components in a substrate is intensively and extensively conducted. Further, attempts to manufacture the electronic systems to be light, slim, short and small have been continuously made. Among the passive components embedded in the substrate, a film type (15~25 μm thick) capacitor is mainly embedded in a substrate. Embedment of the film type capacitor in the substrate is achieved by a process using roll coating, sputtering, or sheet lamination technique. In particular, the sheet lamination technique is highly effective in decreasing a thickness tolerance and expense.

In this regard, the process of manufacturing a PCB having embedded capacitors according to a conventional technique is described with reference to FIGS. 2A to 2F.

First, a PCB 10, in which a resin insulating layer 12 having a metal layer 13, such as copper, formed on either surface thereof, for example, RCC (Resin Coated Copper), is laminated on an inner layer 11, is prepared (FIG. 2A). Although not shown in the drawing, the circuit pattern of the inner layer 11 of the PCB 10 is electrically connected to the circuit pattern of an outer layer through a via hole.

Subsequently, using a photoresist (not shown) such as a dry film, typical exposure/development and etching are performed to thus remove the unnecessary portion of the metal layer 13, thereby forming a circuit layer having a lower electrode 14 and a circuit pattern 15 (FIG. 2B).

Then, the circuit patterns 14, 15 are flattened by filling the spaces therebetween with an insulating resin 16 through a typical flat coating process (FIG. 2C). As such, the reason why the flat coating process is additionally conducted is that a dielectric sheet, which is laminated in a subsequent process, is a dielectric layer containing ceramic powder dispersed therein to thus have almost no flowability, and therefore it is not filled in the spaces between circuit patterns upon lamination.

Subsequently, a single-sided dielectric sheet 20 including a dielectric layer 21 and a metal layer 22, such as copper, formed on one surface of the dielectric layer is laminated (FIG. 2D). Using a photoresist (not shown), such as a dry film, typical exposure/development and etching are conducted to thus remove the unnecessary portion of the metal layer 22, thereby forming a circuit layer having an upper electrode 23 and a circuit pattern 24, 25. Further, a via hole for electrically connecting an interlayer circuit having the upper electrode 23 and the lower electrode 14 is formed, thus completing a capacitor C1 (FIG. 2E).

Finally, a resin insulating layer 17 having a metal layer formed on one surface thereof is laminated through a build-up process, and is then patterned, thus forming an outer circuit pattern 18 (FIG. 2F).

However, the above-mentioned conventional process suffers because the circuit pattern including the upper and lower electrodes is formed through exposure/development and etching for a subtractive process, and thus changes in tolerance of the circuit by an etching process are increased. Ultimately, the PCB having embedded capacitors resulting from the conventional process is difficult to apply to capacitors for RF matching, and also, a flat coating process is additionally required.

SUMMARY OF THE INVENTION

Leading to the present invention, intensive and extensive research into PCBs having embedded capacitors, carried out by the present inventors aiming to avoid the problems encountered in the related art, resulted in the finding that when a capacitor is embedded in a substrate using a novel process comprising forming a circuit layer including a lower electrode through an additive process and then laminating the circuit layer on an insulating layer, a deviation in capacity of the capacitor can be drastically decreased.

Accordingly, a first aspect of the present invention is to provide a PCB having embedded capacitors, which is minimized in deviation of the capacity of the embedded capacitor to thus be applied to capacitors for RF matching, and a method of manufacturing the same.

A second aspect of the present invention is to provide a PCB having embedded capacitors, which does not require a conventional flat coating process and which has high adhesion to the embedded capacitor, and a method of manufacturing the same.

In order to accomplish the above objects, the present invention provides a method of manufacturing a PCB having embedded capacitors, comprising (a) preparing a metal sheet, one surface of which includes a first circuit layer having a lower electrode and a circuit pattern formed through an additive process; (b) preparing a PCB having a resin insulating layer formed thereon; (c) laminating the metal sheet having the first circuit layer on the resin insulating layer of the PCB to dispose the first circuit layer as an inner layer; (d) removing the metal sheet to a thickness direction, thus exposing the first circuit layer and the resin insulating layer; (e) laminating a single-sided dielectric sheet, including a dielectric layer and a metal layer for a second circuit layer formed on one surface of the dielectric layer, on the exposed first circuit layer and resin insulating layer to dispose the metal layer as an outer layer; (f) patterning the metal layer for a second circuit layer, thus forming a second circuit layer including an upper electrode and a circuit pattern; (g) forming a via hole for electrically connecting an interlayer circuit including the upper electrode and the lower electrode; and (h) forming an outer circuit layer through a build-up process.

In the manufacturing method of the present invention, the dielectric layer preferably comprises resin containing ceramic powder dispersed therein.

The ceramic powder may be an oxide of a compound or a mixture thereof selected from the group consisting of Al, Ba, Bi, Ca, Li, La, Mg, Nd, Si, Sm, Sn, Ta, Ti, Zn, Zr, and combinations thereof.

The resin for the dielectric layer is preferably selected from the group consisting of epoxy resin, polyimide resin, liquid crystal polyester resin, and combinations thereof.

The removal of the metal sheet may be conducted through a process selected from the group consisting of chemical etching, chemical polishing, mechanical polishing, and combinations thereof.

The metal sheet may comprise metal selected from the group consisting of Ni, Cu, Fe, Ti, alloys thereof, and combinations thereof, and the metal layer may comprise metal selected from the group consisting of Cu, Al, Ag, Pd, Ni, Cr, Mo, W, alloys thereof, and combinations thereof.

In addition, the present invention provides a PCB having embedded capacitors, comprising (a) a PCB having a resin insulating layer formed thereon; (b) a first circuit layer including a lower electrode and a circuit pattern, which is embedded in the resin insulating layer and exposed to be flush with the insulating layer, and is formed through an additive process; (c) a single-sided dielectric sheet, which is laminated on the resin insulating layer having the first circuit layer embedded therein and exposed to be flush therewith, and includes a dielectric layer and a second circuit layer, facing to the first circuit layer having an upper electrode and a circuit pattern, formed on one surface of the dielectric layer; (d) a via hole for electrically connecting an interlayer circuit having the upper electrode and the lower electrode; and (e) an outer circuit layer formed on the second circuit layer, with a resin insulating layer interposed therebetween.

DESCRIPTION OF THE PREFERRED EMBODIMENTS

Hereinafter, a detailed description will be given of the present invention, with reference to the appended drawings.

The embedded capacitor may be realized through various techniques. To date, the embedded capacitor has been developed in the form of a decoupling capacitor for power stabilization, and has been partially put to practical use. Such a decoupling capacitor does not require a value sensitive to the tolerance of capacity. However, in the case of capacitors for RF matching, which are presently receiving increasing attention, temperature stability should be superior and the tolerance of capacity itself should be small.

The final tolerance of the embedded capacitor is affected by various factors. Among these, the major factor is changes of the capacitor occurring due to an etching process. Conventionally, a tenting process has been used to minimize the changes occurring due to etching, but this process has limitations.

Thus, in the present invention, in order to decrease a tolerance due to etching, there is proposed a novel circuit formation process for material for presently available embedded capacitors. The embedded capacitor manufactured according to the manufacturing method of the present invention may have a tolerance, which is decreased by about 10%, compared to conventional capacitors using a tenting process. That is, the manufacturing method of the present invention is a process enabling a decrease in tolerance from about 15~20% to about 5~10%.

According to the present invention, the PCB having embedded capacitors may have a drastically decreased tolerance to thus be applied to embedded capacitors for RF matching, requiring high integer precision. Further, maximum effects may be realized not through the development of novel material but only through changes in the process and design.

Below, the method of manufacturing a PCB having embedded capacitors according to the preferred embodiment of the present invention is described with reference to FIGS. 1A to 1L.

Figure 1A:
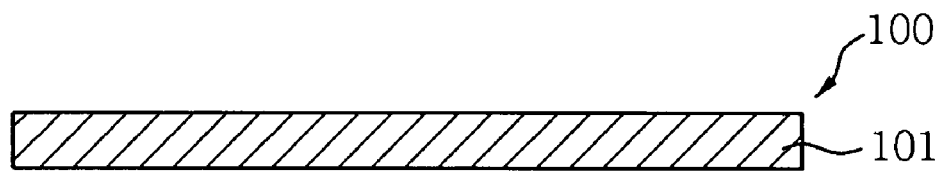
FIGS. 1A to 1L are schematic cross-sectional views sequentially illustrating the process of manufacturing a PCB having embedded capacitors, according to the preferred embodiment of the present invention.
Figure 1B:
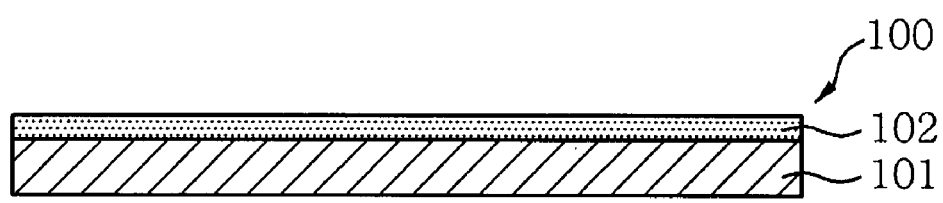
Figure 1C:
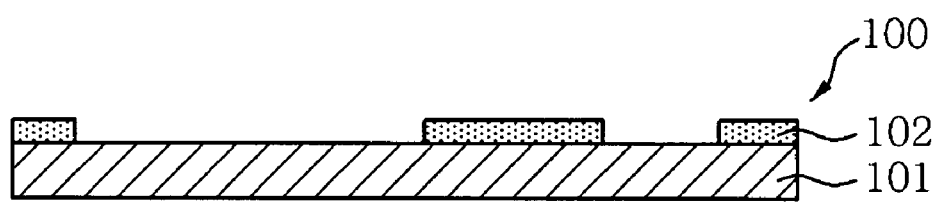
Figure 1D:
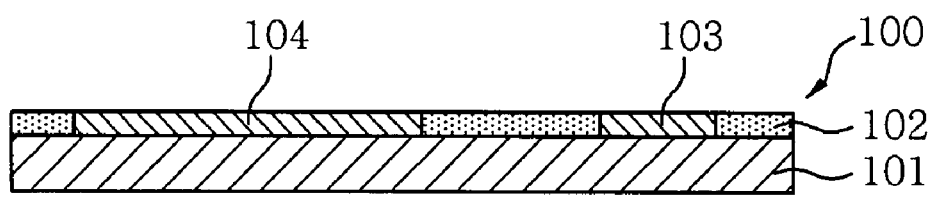
Figure 1E:
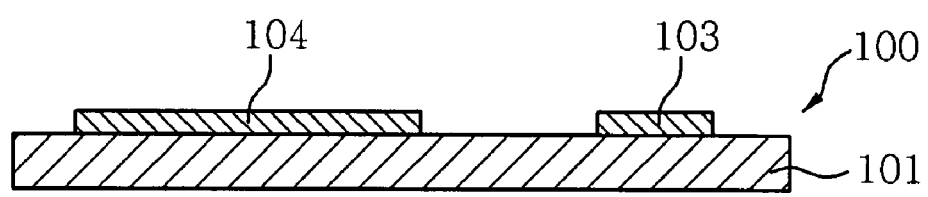

First, a plating resist 102, such as a dry film, is applied on one surface of a metal sheet 101 useful as a transfer medium 100 of a circuit layer including a lower electrode (FIGS. 1A and 1B), and is then patterned through typical exposure/development, thus exposing a region suitable for forming a circuit (FIG. 1C). Subsequently, a metal electroplating layer 103, 104 is formed to the height of a desired circuit through electroless metal plating (FIG. 1D). The plating resist 102 is removed, forming a first circuit layer including a lower electrode 104 and a circuit pattern 103 (FIG. 1E).

The metal sheet is not particularly limited as long as it functions as a medium for transferring the first circuit layer to the insulating layer in a subsequent process. For example, a metal sheet comprising any one or a combination thereof selected from among Ni, Cu, Fe, Ti, and alloys thereof may be used.

The type of metal used in the electroless metal plating typically includes a conductive metal, which is not particularly limited as long as it is used as metal for forming the circuit of a PCB. For example, metal may be selected from the group consisting of Cu, Al, Ag, Pd, Ni, Cr, Mo, W, alloys thereof, and combinations thereof.

Plating for circuit formation is conducted through an additive process using the patterned plating resist 102 as a resist. Thereby, an etching process, which has been applied in a conventional tenting process, may be omitted, and thus the tolerance of the circuit caused by etching may be minimized, consequently increasing the integer precision of the capacity of a capacitor C which is subsequently formed.

Figure 1F:
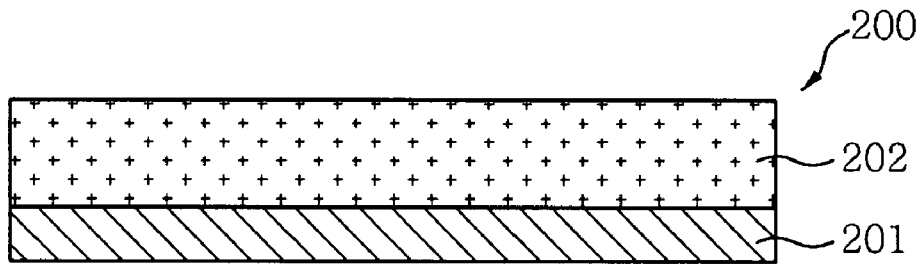

Separately, according to a typical PCB manufacturing method, a PCB 200 having an inner layer 201 and a resin insulating layer 202 formed thereon is prepared (FIG. 1F).

Although not shown in the drawing, the circuit pattern of the inner layer 201 of the PCB 200 is electrically connected to the circuit pattern of an outer layer through a via hole. In the drawing, the detailed structure of the inner layer is omitted, and only the structure of the single-sided PCB is schematically shown, but the process of the present invention may be applied to double-sided PCBs. According to the actual end uses, single-sided, double-sided or built-up PCBs, having various shapes, may be used, and the number of circuit layers may vary, which will be apparent to those skilled in the art. As the insulating resin and circuit metal used in each layer, any material may be used without limitation as long as it is typically used in the art. For example, the insulating resin includes epoxy glass resin or BT resin, and the circuit metal typically includes copper.

Figure 1G:
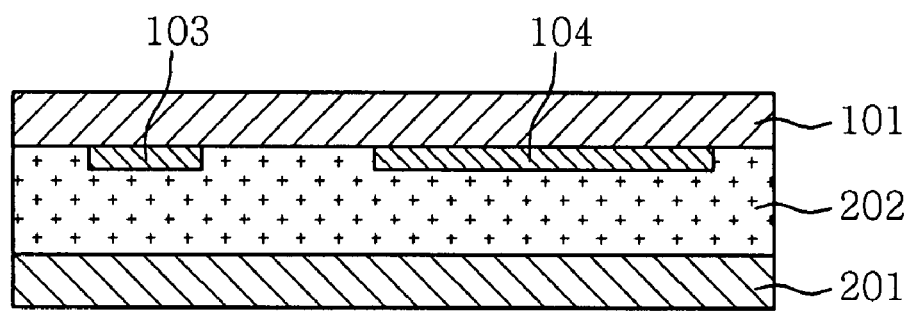

The transfer medium 100 having the first circuit layer 103, 104 is laminated on the resin insulating layer 202 of the PCB 200 under predetermined temperature and pressure conditions to dispose the first circuit layer 103, 104 as an inner layer (FIG. 1G). Through such a lamination process, the first circuit layer 103, 104 of the transfer medium 100 is embedded in the resin insulating layer 202 of the PCB 200.

Figure 1H:
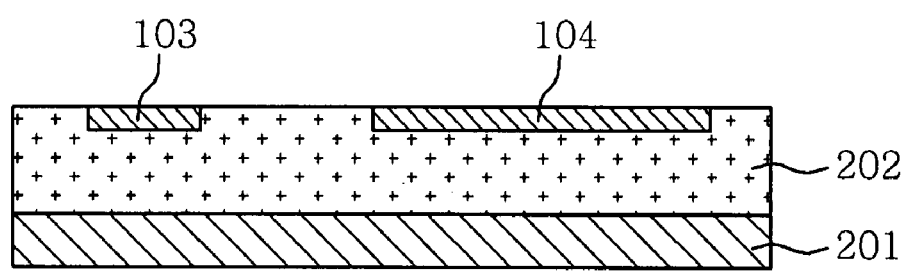

After the lamination, the metal sheet 101, which is unnecessary, is removed to a thickness direction, and thus the first circuit layer 103, 104 and the resin insulating layer 202 are exposed (FIG. 1H).

Although the process of removing the metal sheet 101 is not particularly limited, for example, any one or a combination of two or more selected from among chemical etching, chemical polishing, and mechanical polishing, which are typically known in the art, may be conducted.

Figure 1I:
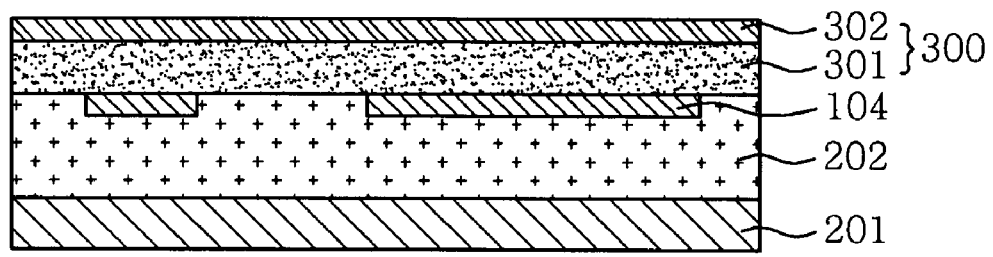

On the first circuit layer 103, 104 and the resin insulating layer 202 thus exposed, a dielectric sheet 300 including a dielectric layer 301 and a metal layer 302 for a second circuit layer formed on one surface of the dielectric layer is laminated under predetermined temperature and pressure conditions so as to dispose the metal layer 302 as an outer layer (FIG. 1I).

The dielectric layer 301 may comprise resin containing ceramic powder dispersed therein. The ceramic powder is not particularly limited as long as it is dispersed in the dielectric layer of the PCB. Preferably useful is an oxide of a compound or a mixture thereof selected from the group consisting of Al, Ba, Bi, Ca, Li, La, Mg, Nd, Si, Sm, Sn, Ta, Ti, Zn, Zr and combinations thereof. Examples of ceramic powder include $ZnO-MgO-SiO_2$, MCT of $CaCO_3-TiO_2-MgO$, $BaTiO_3-TiO_2$, ZST of $ZrO_2-SnO_2-TiO_2$, $CaCO_3-TiO_2-La_2O_3-Al_2O_3$, $BaTiO_3-TiO_2-Nd_2O_3-Sm_2O_3-Bi_2O_3$, $CaCO_3-TiO_2-Nd_2O_3-Li_2CO_3$, and Ba-based complex perovskite ceramic powder, such as BZT of $BaO-ZnO-Ta_2O_5$, and BMT of $BaO-MgO-Ta_2O_5$. As the resin for the dielectric layer, any one or a combination of two or more selected from among epoxy resin, polyimide resin, and liquid crystal polyester resin may be used, but the present invention is not limited thereto.

The metal for the metal layer 302 is not particularly limited as long as it is used as metal for circuits, and may be selected from the group consisting of Cu, Al, Ag, Pd, Ni, Cr, Mo, W, alloys thereof, and combinations thereof.

Figure 1J:
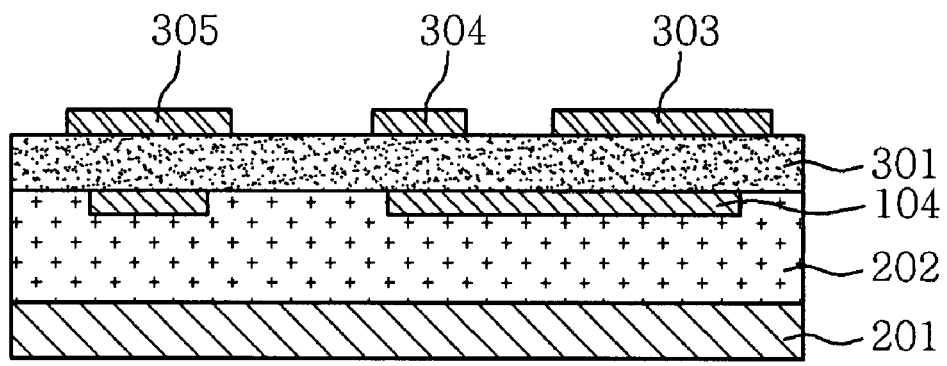
Figure 1K:
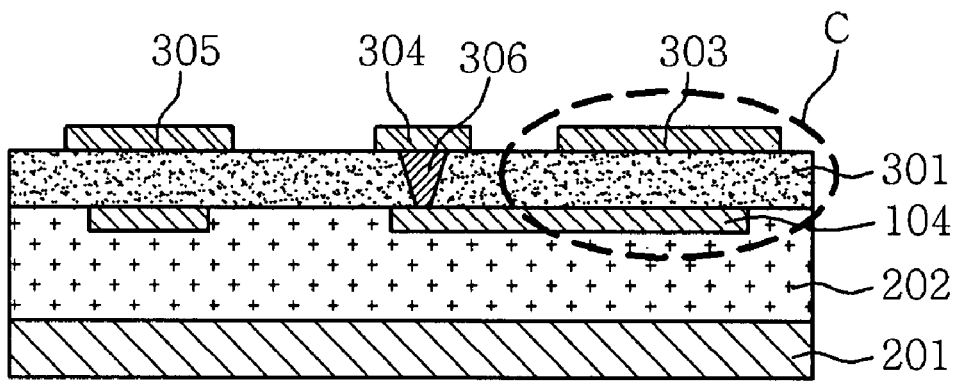

Subsequently, the metal layer 302 for a second circuit layer is patterned through exposure/development and etching to thus form a second circuit layer including an upper electrode 303 and a circuit pattern 304, 305 (FIG. 1J). Through typical via machining, a via hole 306 for electrically connecting an interlayer circuit including the upper electrode 303 and the lower electrode 104 is formed, thereby realizing an embedded capacitor C (FIG. 1K).

Figure 1L:
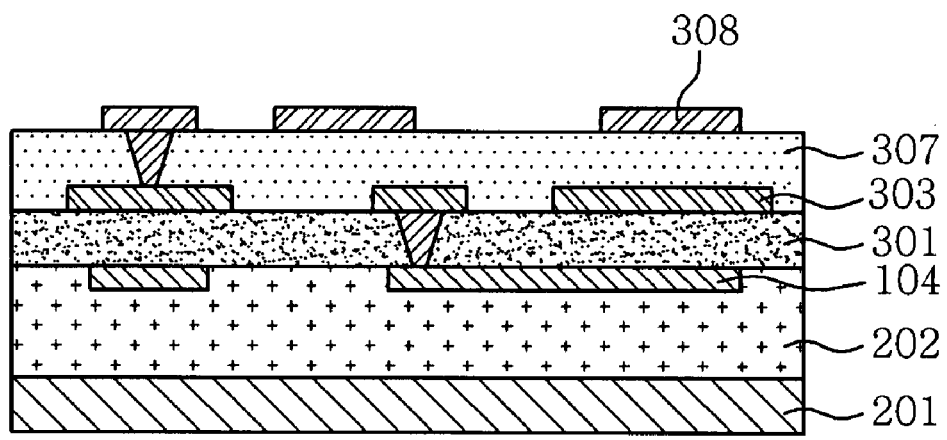
Figure 2A:
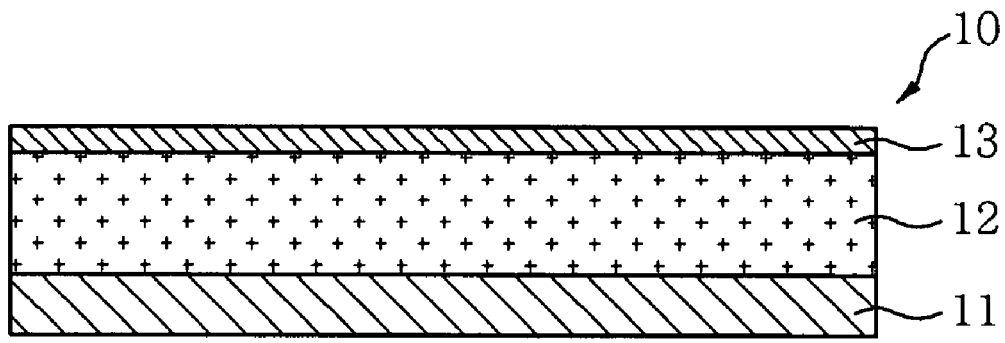
FIGS. 2A to 2F are schematic cross-sectional views sequentially illustrating the process of manufacturing a PCB having embedded capacitors, according to a conventional technique.
Figure 2B:
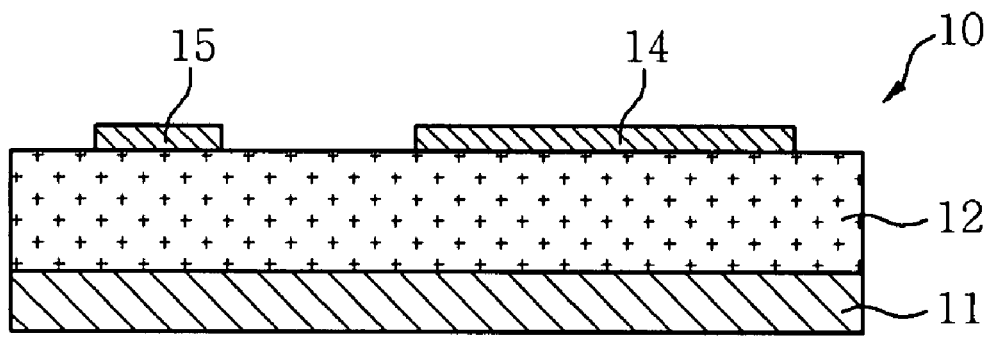
Figure 2C:
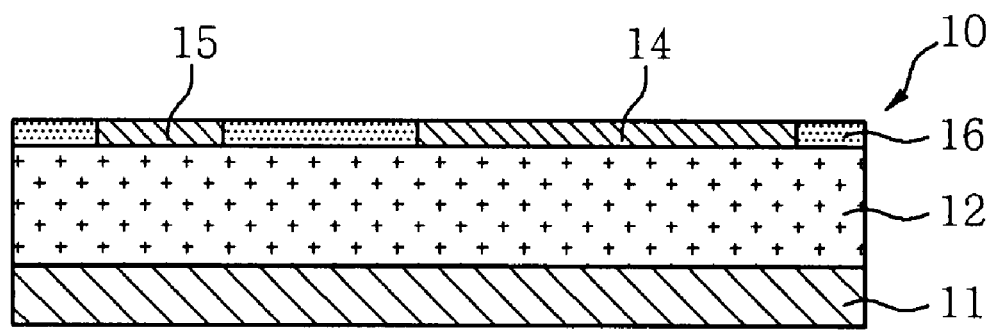
Figure 2D:
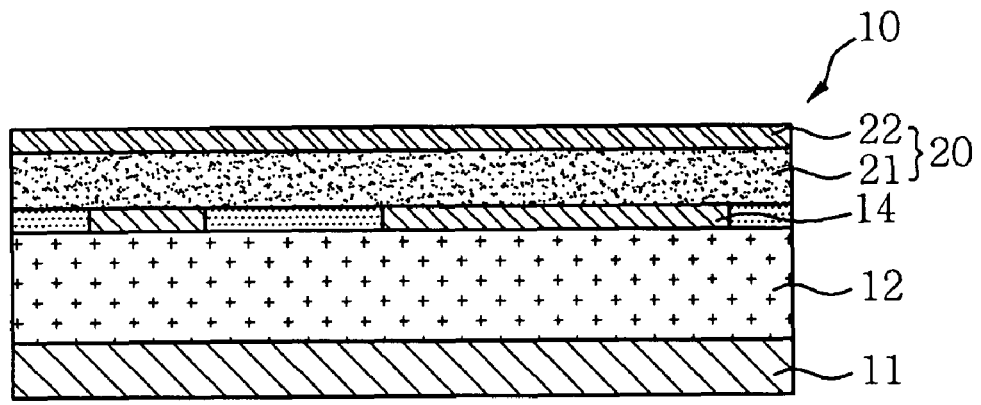
Figure 2E:
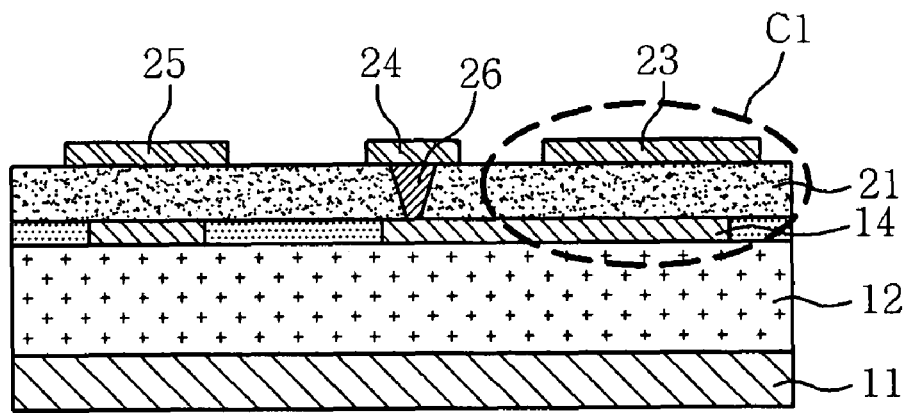
Figure 2F:
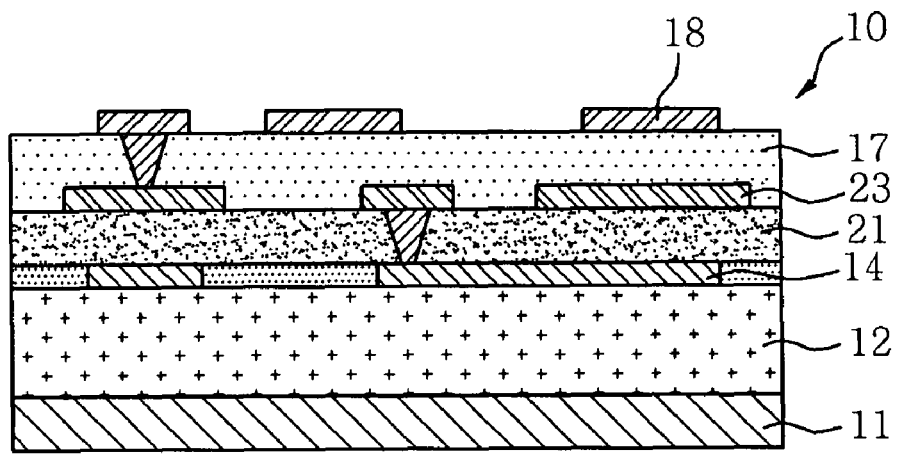

Finally, a resin insulating layer 307 and a metal layer 308 are laminated through a typical build-up process, and are then patterned through exposure/development and etching, thus forming an outer circuit layer 308 (FIG. 1L). The number of circuit layers to be built-up on the outer layer may vary depending on the end uses.

As mentioned above, the embedded capacitor manufactured according to the method of the present invention has a tolerance decreased by about 10% compared to conventional capacitors manufactured using a tenting process, and thus may be used as embedded capacitors for RF matching, requiring high integer precision. Furthermore, whereas a conventional circuit having a lower electrode, formed through a subtractive process including etching, has a tolerance of about ±10 μm or more, the circuit formed through an additive process according to the present invention has a tolerance of about ±5 μm or less, leading to high integer precision.

A better understanding of the present invention may be obtained by way of the following example, which is set forth to illustrate, but is not to be construed to limit, the present invention.

EXAMPLE

Using epoxy resin containing 80 wt % of $BaTiO_3$ as a dielectric layer, a PCB having embedded capacitors, in which the dielectric layer was about 16±1 μm thick and the upper and lower Cu electrodes each were about 12 μm thick, was manufactured according to the processes of FIGS. 1A to 1L.

Figure 3:
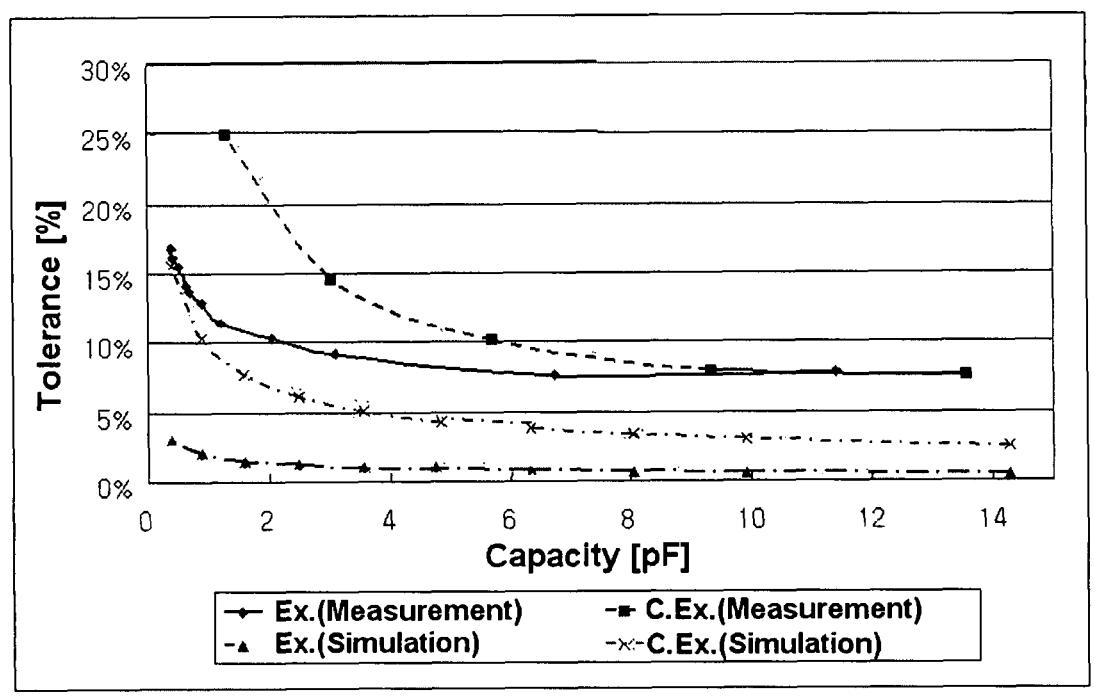
FIG. 3 is a graph illustrating the tolerance varying depending on the capacity of the embedded capacitor of the example of the present invention, compared to that of the capacitor of the comparative example.

The properties of the embedded capacitor thus manufactured were measured. The results are shown in Table 1 below. Further, the simulation value and actual value of tolerance depending on changes in capacity of the capacitor were determined. The results are shown in FIG. 3.

TABLE 1

| Dielectric Layer | Epoxy Resin + $BaTiO_3$ (80 wt %) |
|---|---|
| Thickness of Dielectric Layer (μm) | 16 ± 1 μm |
| Dk @ 1 MHz | 30 |
| tanδ @ 1 MHz | 0.019 |
| TCC | 15% (−55~125° C.) |
| $pF/mm^2$ | 16 |
| Electrode (Cu) Thick. (μm) | 12 |
| BVD (Breakdown Voltage) | >250 volts |

COMPARATIVE EXAMPLE

Using epoxy resin containing 80 wt % of $BaTiO_3$ as a dielectric layer, a PCB having embedded capacitors, in which the dielectric layer was about 16±1 μm thick and the upper and lower Cu electrodes each were about 12 μm thick, was manufactured according to the processes of FIGS. 2A to 2F.

The simulation value and actual value of tolerance depending on changes in capacity of the capacitor were determined. The results are shown in FIG. 3.

As is apparent from Table 1 and FIG. 3, the embedded capacitor (example) according to the present invention exhibits a considerably low tolerance even in a low capacity range of 0.5~10 pF, resulting in superior integer precision, compared to the embedded capacitor (comparative example) according to the conventional technique.

Although the preferred embodiments of the present invention, with regard to the PCB having embedded capacitors and the method of manufacturing the same, have been disclosed for illustrative purposes, those skilled in the art will appreciate that various modifications, additions and substitutions are possible, without departing from the technical spirit of the invention.

As described hereinbefore, the present invention provides a PCB for improving the tolerance of embedded capacitors, and a method of manufacturing the same. According to the present invention, a circuit having a lower electrode is formed using an additive process, thus making it possible to decrease the tolerance of the circuit, compared to when using a conventional subtractive process including etching. Further, since the circuit layer including the lower electrode is embedded in the resin insulating layer, the need for a flat coating process required in a conventional technique may be eliminated, and adhesion between the embedded capacitor and the substrate may be increased.

The modifications, additions and substitutions fall within the scope of the present invention as disclosed in the accompanying claims.

What is claimed is:

1. A method of manufacturing a printed circuit board having embedded capacitors, comprising:
   preparing a metal sheet, one surface of which includes a first circuit layer having a lower electrode and a circuit pattern formed in one circuit layer through an additive process;
   preparing a printed circuit board having a resin insulating layer formed thereon;
   laminating the metal sheet having the first circuit layer on the resin insulating layer of the printed circuit board to dispose the first circuit layer as an inner layer;
   removing the metal sheet to a thickness direction, thus exposing the first circuit layer and the resin insulating layer to the outside;
   laminating a single-sided dielectric sheet, including a dielectric layer and a metal layer for a second circuit layer formed on one surface of the dielectric layer, on the exposed first circuit layer and resin insulating layer to dispose the metal layer as an outer layer;
   patterning the metal layer for a second circuit layer, thus forming a second circuit layer including an upper electrode and a circuit pattern;
   forming a via hole for electrically connecting an interlayer circuit including the upper electrode and the lower electrode; and
   forming an outer circuit layer through a build-up process.

2. The method as set forth in claim 1, wherein the dielectric layer comprises resin containing ceramic powder dispersed therein.

3. The method as set forth in claim 2, wherein the ceramic powder is an oxide of a compound or a mixture thereof selected from a group consisting of Al, Ba, Bi, Ca, Li, La, Mg, Nd, Si, Sm, Sn, Ta, Ti, Zn, Zr, and combinations thereof.

4. The method as set forth in claim 2, wherein the resin is selected from a group consisting of epoxy resin, polyimide resin, liquid crystal polyester resin, and combinations thereof.

5. The method as set forth in claim 1, wherein the removing the metal sheet is conducted through a process selected from a group consisting of chemical etching, chemical polishing, mechanical polishing, and combinations thereof.

6. The method as set forth in claim 1, wherein the metal sheet comprises metal selected from a group consisting of Ni, Cu, Fe, Ti, alloys thereof, and combinations thereof.

7. The method as set forth in claim 1, wherein the metal layer comprises metal selected from a group consisting of Cu, Al, Ag, Pd, Ni, Cr, Mo, W, alloys thereof, and combinations thereof.

8. A printed circuit board having embedded capacitors, comprising:
   printed circuit board having a resin insulating layer formed thereon;
   first circuit layer including a lower electrode and a circuit pattern, which is embedded in the resin insulating layer and exposed to be flush with the insulating layer, and is formed in one circuit layer through an additive process;
   a single-sided dielectric sheet, which is laminated on the resin insulating layer having the first circuit layer embedded therein and exposed to be flush therewith, and includes a dielectric layer and a second circuit layer, facing to the first circuit layer and having an upper electrode and a circuit pattern, formed on one surface of the dielectric layer;
   a via hole for electrically connecting an interlayer circuit having the upper electrode and the lower electrode; and
   an outer circuit layer formed on the second circuit layer, with a resin insulating layer interposed therebetween.

9. The printed circuit board as set forth in claim 8, wherein the dielectric layer comprises resin containing ceramic powder dispersed therein.

10. The printed circuit board as set forth in claim 9, wherein the ceramic powder is an oxide of a compound or a mixture thereof selected from a group consisting of Al, Ba, Bi, Ca, Li, La, Mg, Nd, Si, Sm, Sn, Ta, Ti, Zn, Zr, and combinations thereof.

11. The printed circuit board as set forth in claim 9, wherein the resin is selected from a group consisting of epoxy resin, polyimide resin, liquid crystal polyester resin, and combinations thereof.

* * * * *

UNITED STATES PATENT AND TRADEMARK OFFICE
CERTIFICATE OF CORRECTION

PATENT NO. : 8,022,311 B2
APPLICATION NO. : 11/797084
DATED : September 20, 2011
INVENTOR(S) : Kim et al.

Page 1 of 1

It is certified that error appears in the above-identified patent and that said Letters Patent is hereby corrected as shown below:

Column 8, Line 28, In Claim 8, before "printed" insert -- a --.

Column 8, Line 30, In Claim 8, before "first" insert -- a --.

Signed and Sealed this
Seventh Day of February, 2012

David J. Kappos
*Director of the United States Patent and Trademark Office*